(12) United States Patent
Sauer et al.

(10) Patent No.: US 9,998,090 B2
(45) Date of Patent: Jun. 12, 2018

(54) ELECTROACOUSTIC COMPONENT AND METHOD FOR THE PRODUCTION THEREOF

(71) Applicant: Snaptrack Inc., San Diego, CA (US)

(72) Inventors: Wolfgang Sauer, Taufkirchen (DE); Thomas Kauschke, Munich (DE); Thomas Bauer, Munich (DE)

(73) Assignee: QUALCOMM Incorporated, San Diego, CA (US)

( * ) Notice: Subject to any disclaimer, the term of this patent is extended or adjusted under 35 U.S.C. 154(b) by 591 days.

(21) Appl. No.: 14/434,370

(22) PCT Filed: Nov. 6, 2013

(86) PCT No.: PCT/EP2013/073181
§ 371 (c)(1),
(2) Date: Apr. 8, 2015

(87) PCT Pub. No.: WO2014/075974
PCT Pub. Date: Mar. 22, 2014

(65) Prior Publication Data
US 2015/0270824 A1    Sep. 24, 2015

(30) Foreign Application Priority Data
Nov. 19, 2012 (DE) .................. 10 2012 111 121

(51) Int. Cl.
*H03H 9/02* (2006.01)
*H03H 3/02* (2006.01)
(Continued)

(52) U.S. Cl.
CPC .......... *H03H 9/02905* (2013.01); *H03H 3/02* (2013.01); *H03H 3/08* (2013.01);
(Continued)

(58) Field of Classification Search
CPC .......... H03H 9/02; H03H 9/725; H03H 9/145
See application file for complete search history.

(56) References Cited

U.S. PATENT DOCUMENTS

| | | |
|---|---|---|
| 2005/0057117 A1 | 3/2005 | Nakatsuka et al. |
| 2010/0060102 A1 | 3/2010 | Goto et al. |

(Continued)

FOREIGN PATENT DOCUMENTS

| | | |
|---|---|---|
| DE | 102010034121 A1 | 2/2012 |
| JP | H02301210 A | 12/1990 |

(Continued)

OTHER PUBLICATIONS

International Search Report and Written Opinion—PCT/EP2013/073181—ISA/EPO—dated Jan. 23, 2014.

*Primary Examiner* — J. San Martin
(74) *Attorney, Agent, or Firm* — Patterson & Sheridan, LLP

(57) ABSTRACT

An electroacoustic component is specified in which the disturbing contributions of undesired wave modes are reduced. For this purpose, a component includes a piezo layer, an electrode layer and a separating layer. A main mode and a secondary mode are capable of propagation in the component. The separating layer has an opposite thickness dependence for the frequencies of the main mode and of the secondary mode.

18 Claims, 6 Drawing Sheets

(51) Int. Cl.
 *H03H 3/08* (2006.01)
 *H03H 9/25* (2006.01)
 H03H 9/145 (2006.01)
 H03H 9/72 (2006.01)

(52) U.S. Cl.
 CPC .......... *H03H 9/02818* (2013.01); *H03H 9/25* (2013.01); *H03H 9/02559* (2013.01); *H03H 9/14541* (2013.01); *H03H 9/725* (2013.01); *Y10T 29/42* (2015.01)

(56) References Cited

U.S. PATENT DOCUMENTS

| | | |
|---|---|---|
| 2010/0097161 A1 | 4/2010 | Nakamura et al. |
| 2010/0141088 A1 | 6/2010 | Matsuda et al. |
| 2010/0244624 A1 | 9/2010 | Matsuda et al. |
| 2012/0038435 A1 | 2/2012 | Yata et al. |
| 2013/0200960 A1* | 8/2013 | Sauer ................ H03H 3/10 333/133 |
| 2013/0285504 A1 | 10/2013 | Tamasaki |

FOREIGN PATENT DOCUMENTS

| | | |
|---|---|---|
| JP | 2005117641 A | 4/2005 |
| JP | 2008131128 A | 6/2008 |
| JP | 2009022410 A | 2/2009 |
| JP | 2010088109 A | 4/2010 |
| JP | 2010226636 A | 10/2010 |
| JP | 2011244065 A | 12/2011 |
| JP | 2012169760 A | 9/2012 |
| JP | 2013138333 A | 7/2013 |
| WO | WO-2009022410 A1 | 2/2009 |
| WO | 2012019904 A1 | 2/2012 |
| WO | 2012090698 A1 | 7/2012 |

* cited by examiner

ELECTROACOUSTIC COMPONENT AND METHOD FOR THE PRODUCTION THEREOF

This patent application is a national phase filing under section 371 of PCT/EP2013/073181, filed Nov. 6, 2013, which claims the priority of German patent application 10 2012 111 121.9, filed Nov. 19, 2012, each of which is incorporated herein by reference in its entirety.

TECHNICAL FIELD

The invention relates to electroacoustic components having reduced disturbances resulting from undesired wave modes, and to methods for producing such components.

BACKGROUND

Electroacoustic components can be used in RF filter circuits, e.g., mobile communication devices. In such components, electrode structures convert between electromagnetic RF signals and acoustic waves. The acoustic waves generally propagate in an acoustic track at the interface of a piezoelectric material, e.g., as a surface acoustic wave (SAW), or as a guided bulk acoustic wave (GBAW). Such electroacoustic components are known, for example, from German Patent Application DE 102010034121 or U.S. Publication No. 2012/0038435.

What is problematic about known electroacoustic components is that undesired wave modes, e.g., secondary modes, impair the filter characteristic especially in critical frequency ranges. In the filters in U.S. Publication No. 2012/0038435, additional resonators or additional dielectric layers are provided in order to suppress undesired modes, e.g., at frequencies above a passband.

Additional layers make production more expensive and additional resonators make production more expensive and increase the space requirement of corresponding components.

SUMMARY

Embodiments of the present invention specify an alternative component which has reduced contributions by disturbing modes and in which the need for complex measures for reducing the contributions is obviated. Further embodiments specify a method for producing such a component.

Technical features are mentioned below which can interact in any desired combination in order to obtain a component that meets specific requirements.

The electroacoustic component comprises a piezo layer, an electrode layer above the piezo layer, and a separating layer. A main mode having a frequency $f_m$ and a secondary mode having a frequency $f_{add}$ are capable of propagation in the electroacoustic component. The separating layer has an opposite thickness dependence for the frequencies $f_m$ and $f_{add}$.

It is possible for the propagation velocity of the main mode to increase as the layer thickness increases. By contrast, the propagation velocity of the secondary mode decreases. As a result, the resonant frequency of the main mode $f_m$ and the resonant frequency of the secondary mode $f_{add}$ have an opposite thickness dependence.

In this case, the piezo layer is a layer comprising a piezoelectric material, e.g., a monocrystalline piezoelectric substrate or a piezoelectric layer. The electrode layer is arranged above the piezo layer and can comprise electrode structures, e.g., interdigital transducers and reflectors, for converting between electromagnetic RF signals and acoustic waves. The separating layer is a material layer of the electroacoustic component and serves to shift the frequency $f_{add}$ of the secondary mode relative to the frequency $f_m$ of the main mode. For this purpose, the separating layer has the opposite thickness dependence for the frequencies. An opposite thickness dependence for the frequencies is characterized in that the frequency difference $f_m-f_{add}$ decreases as the thickness of the separating layer increases. In other words: as a result of the thickness of the separating layer being increased, the frequencies $f_m$ and $f_{add}$ move toward one another.

In this case, the main mode having the frequency $f_m$ is a wave mode which can be used, e.g., for forming a passband. The secondary mode having the frequency $f_{add}$ is a generally undesired wave mode which is excited in addition to the main mode.

It is possible for the secondary mode to have a higher frequency than the main mode. If a conventional electroacoustic component comprises a resonator having a resonance at approximately 1810 MHz and an anti-resonance at approximately 1840 MHz, then the resonator can be used in a passband filter for forming a passband at precisely these frequencies. However, this resonator can have a secondary mode at a frequency of approximately 2415 MHz, which falls, e.g., within the Bluetooth frequency range and thus interferes with transmission or reception of Bluetooth signals by a corresponding mobile communication device.

Although it is possible in principle for the separating layer to reduce the bandwidth of a corresponding bandpass filter or the PZD (PZD=pole zero distance=resonance–antiresonance distance) or the electroacoustic coupling, the present component makes it possible, with good tuning, to shift the frequency position of the secondary mode from such a critical frequency range by adapting the thickness of the separating layer, without impairing the frequency response of the main mode.

In one embodiment, the main mode is a Rayleigh mode and the secondary mode is a Love mode. In this case, the separating layer is arranged above the electrode layer.

In one embodiment, the electroacoustic component furthermore comprises a temperature-compensating TCF layer (TCF=temperature coefficients of frequency) between the electrode layer and the separating layer. The temperature dependence of the characteristic frequencies of a component is reduced or eliminated by the TCF layer.

In one embodiment, the component comprises a bottom adhesion layer between the piezo layer and the electrode layer and/or a top adhesion layer between the electrode layer and the TCF layer. It is therefore possible for a bottom adhesion layer to improve the adhesion of the electrode layer. Independently of the existence of the bottom adhesion layer, it is possible for the top adhesion layer to improve the adhesion of the TCF layer.

In one embodiment, the piezo layer comprises $LiNbO_3$ (lithium niobate), e.g., an $LiNbO_3$ single crystal, or $LiTaO_3$ (lithium tantalate), e.g., an $LiTaO_3$ single crystal. Furthermore, the bottom adhesion layer and/or the top adhesion layer, if respectively present, comprise(s) Ti (titanium). The electrode layer comprises Cu (copper) or Ag (silver). The separating layer comprises $Si_3N_4$ (silicon nitride).

In one embodiment, the piezo layer comprises a 128° Y-X cut $LiNbO_3$ substrate. The bottom adhesion layer comprises a 5.5 nm thick Ti layer. The electrode layer comprises a 2.5 nm thick Ag layer and a 160 nm thick Cu layer arranged thereon. The top adhesion layer comprises a 5.5 nm thick Ti layer. The TCF layer comprises a 700 nm to 730 nm thick SiO₂ layer (SiO₂=silicon dioxide). The separating layer comprises a 20 nm to 80 nm thick Si₃N₄ layer.

Such a component can make available, in particular, a layer stack for WCDMA band 2 applications.

In one embodiment of the component, the piezo layer comprises a 128° Y-X cut LiNbO₃ substrate. The bottom adhesion layer comprises a 5.5 nm thick Ti layer. The electrode layer comprises a 2.5 nm thick Ag layer and a 160 nm thick Cu layer arranged thereon. The top adhesion layer comprises a 5.5 nm thick Ti layer. The TCF layer comprises a 700 nm to 730 nm thick SiO₂ layer and the separating layer comprises an 80 nm to 140 nm thick Si₃N₄ layer.

Such a layer stack is advantageous for WCDMA band 2 applications since an undesired secondary mode is shifted into a non-critical frequency layer below the ISM band (ISM=industrial, scientific and medical).

In one embodiment, the separating layer has a thickness of 110 nm.

In one embodiment, the component is part of a duplexer operating with surface acoustic waves (SAW) and having a transmission filter and a reception filter. The transmission filter in this case has a metallization ratio of η=0.44 and the reception filter has a metallization ratio of η=0.55.

A method for producing an electroacoustic component in which a main mode having a frequency $f_m$ and a secondary mode having a frequency $f_{add}$ are capable of propagation comprises the following steps. An electrode layer is arranged above a piezo layer. A separating layer is arrayed above the electrode layer. The frequencies $f_m$ and $f_{add}$ are separated by increasing the thickness of the separating layer.

In one configuration of the method, manufacturing variations are reduced by the reduction of the thickness of the separating layer being carried out in a spatially resolved manner.

In this case, the layer stacks of a multiplicity of electroacoustic components are deposited simultaneously on a wafer. Some selected components are subsequently characterized by contacting with a sample measuring head. In this case, essentially the frequencies of the main mode and of the secondary mode of these selected components are determined. On the basis of these data, it is then possible to determine how much material of the separating layer has to be removed at what location of the wafer in order to obtain the greatest possible number of correctly tuned components.

BRIEF DESCRIPTION OF THE DRAWINGS

The electroacoustic component is explained in greater detail below on the basis of exemplary embodiments and associated schematic figures, in which.

DETAILED DESCRIPTION OF ILLUSTRATIVE EMBODIMENTS

Figure 1:
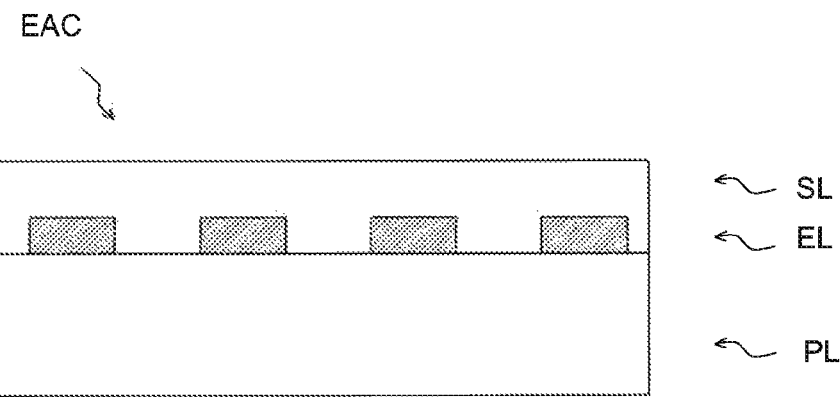
FIG. 1 shows an electroacoustic component EAC comprising a piezo layer PL, an electrode layer EL and a separating layer SL.

FIG. 1 shows an embodiment of an electroacoustic component EAC comprising a piezo layer PL. The piezo layer PL comprises piezoelectric material, e.g., LiTaO₃, LiNbO₃ or quartz. An electrode layer EL is arranged above the piezo layer PL. In particular electrode structures, e.g., of interdigital transducers (IDT), are arranged in the electrode layer EL. In this case, the electrode layer EL can be seated directly on the piezo layer PL. However, it is also possible for an adhesion promoting layer, which can comprise Ti, for example, to be arranged between the electrode layer EL and the piezo layer PL. The separating layer SL is arranged above the electrode layer EL, said separating layer improving the characteristic of the component by making it possible, by virtue of its opposite thickness dependence, to shift the frequency of the undesired secondary mode relative to the frequency of the main mode. Further layers can be arranged between the separating layer SL and the electrode layer EL. In this regard, it is possible, for example, for a TCF layer (=temperature compensation layer) TCF, which can comprise SiO₂, for example, to be arranged between the electrode layer EL and the separating layer SL. Furthermore, a top adhesion promoting layer TAL, which can likewise comprise Ti, can be arranged between the electrode layer EL and a TCF layer. The material of a TCF layer can likewise fill the volume between the electrode structures.

Figure 2:
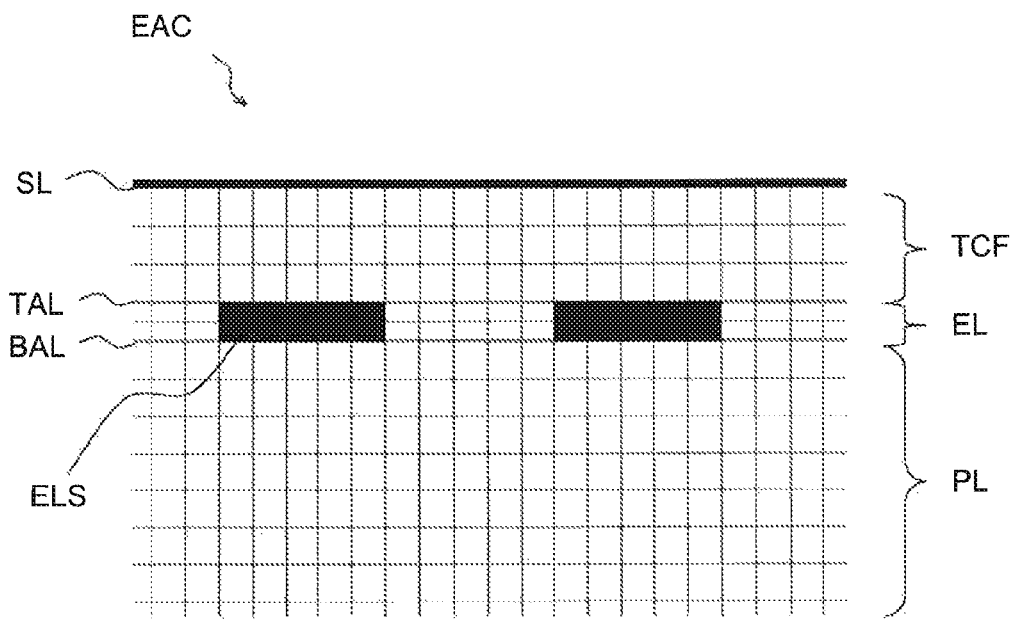
FIG. 2 shows an electroacoustic component EAC comprising a bottom adhesion layer BAL, a top adhesion layer TAL and an TCF layer TCF.

FIG. 2 shows a configuration of the electroacoustic component EAC, in which a bottom adhesion layer BAL is arranged between the electrode layer EL and the piezo layer PL. A TCF layer TCF is arranged between the electrode layer EL and the separating layer SL. A top adhesion promoting layer TAL is arranged between the TCF layer and the electrode layer.

Figure 3:
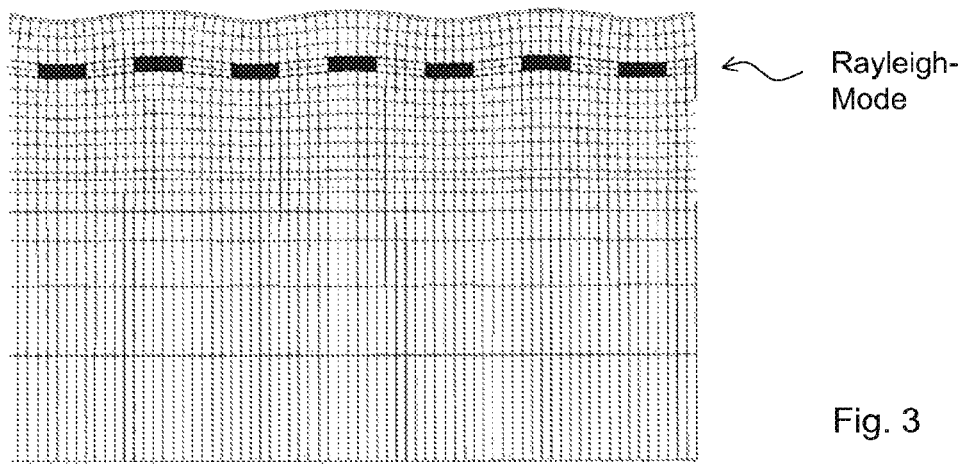
FIG. 3 shows a Rayleigh mode.

FIG. 3 schematically symbolizes the deflection of the different layers during the propagation of a Rayleigh mode.

Figure 4:
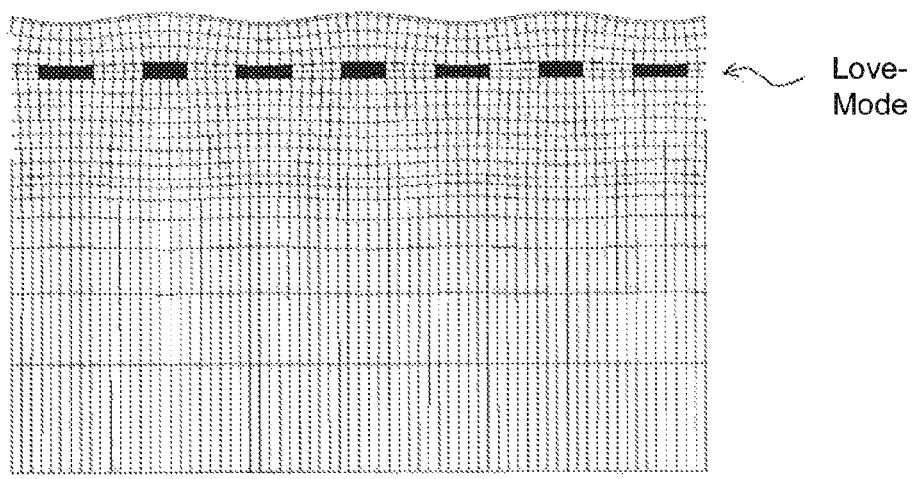
FIG. 4 shows a Love mode.

By contrast, FIG. 4 schematically shows the deflection of the layers during the propagation of a Love mode. The different modes have different propagation velocities. They therefore arise at different frequencies for the same wavelength predefined by the electrode structures. In this regard, the Rayleigh mode propagates, e.g., at a frequency of 1800 MHz, while the Love mode propagates at a frequency of 2400 MHz.

Figure 5:
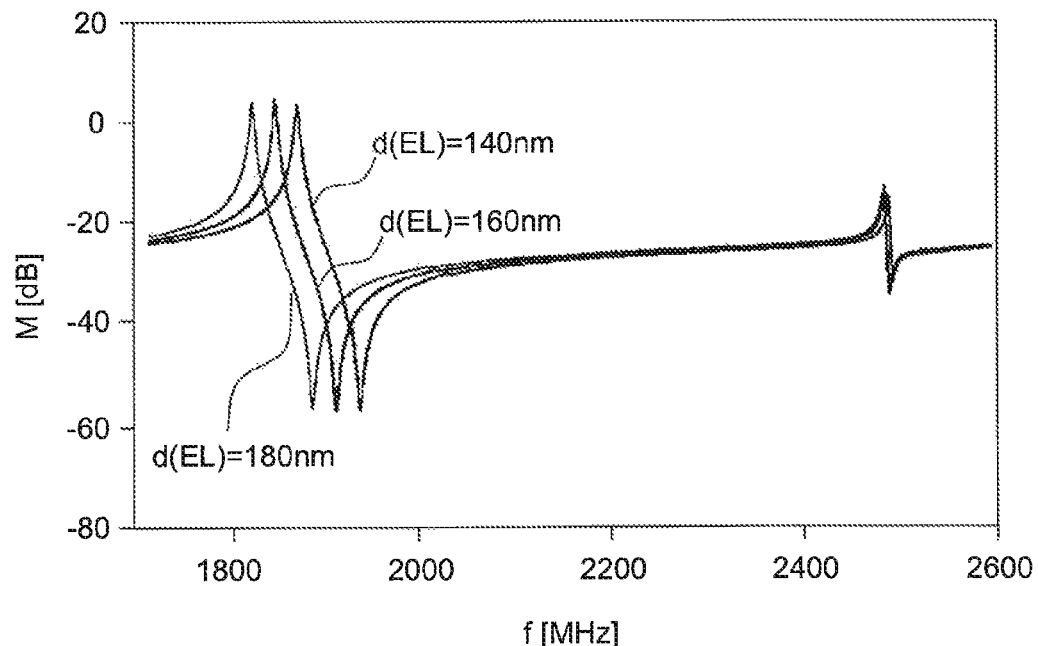
FIG. 5 shows the magnitude of the admittance of an electroacoustic transducer (e.g., an interdigitial transducer) having pronounced resonances of the main mode and of the secondary mode.

FIG. 5 shows the dependence of the frequency position of the main mode on the thickness of the electrode layer EL. In comparison with an electrode layer EL having the thickness of 160 nm, the resonant and antiresonant frequencies are shifted to higher frequencies in the case of a 140 nm thick electrode layer, while the resonant and respectively antiresonant frequencies are shifted toward lower values in the case of a thicker, 180 nm thick, electrode layer EL. The resonant and antiresonant frequencies of the secondary mode are manifested substantially independently of the thickness of the electrode layer EL.

Figure 6:
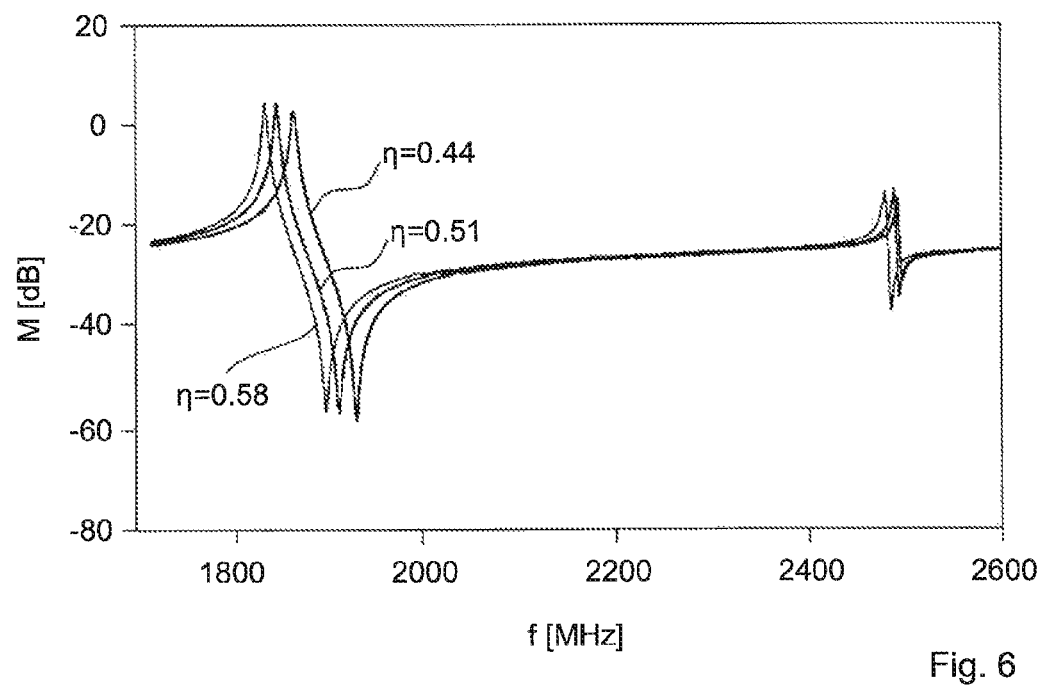
FIG. 6 shows the magnitude of the admittance of an electroacoustic transducer (e.g., an interdigitial transducer) having pronounced resonances of the main mode and of the secondary mode.

FIG. 6 shows the dependence of the position of the resonant and respectively antiresonant frequencies of the main mode on the metallization ratio η. While an increase in the metallization ratio from 0.51 to 0.58 entails a reduction in the frequencies of the main mode, a decrease in the metallization ratio to 0.44 brings about an increase in the frequencies. The resonant and respectively antiresonant frequencies once again exhibit a significantly smaller dependence of the secondary mode on the metallization ratio.

Figure 7:
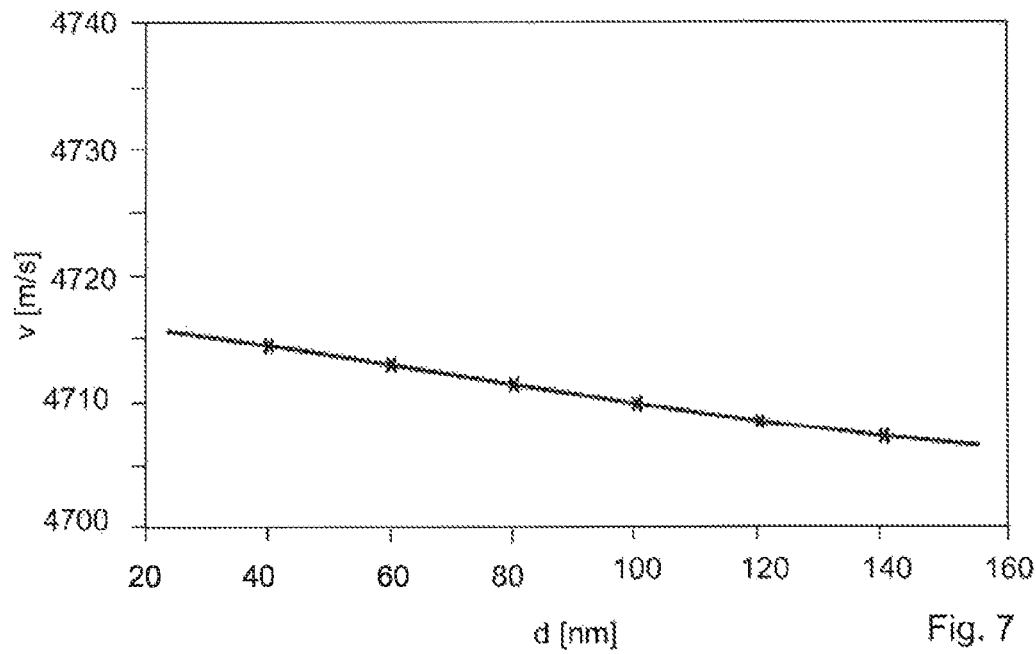
FIG. 7 shows the thickness-dependent velocity of a Love mode.

FIG. 7 shows the calculated propagation velocity of a Love mode, e.g., of a secondary mode, as a function of the layer thickness. The velocity decreases as the thickness increases.

Figure 8:
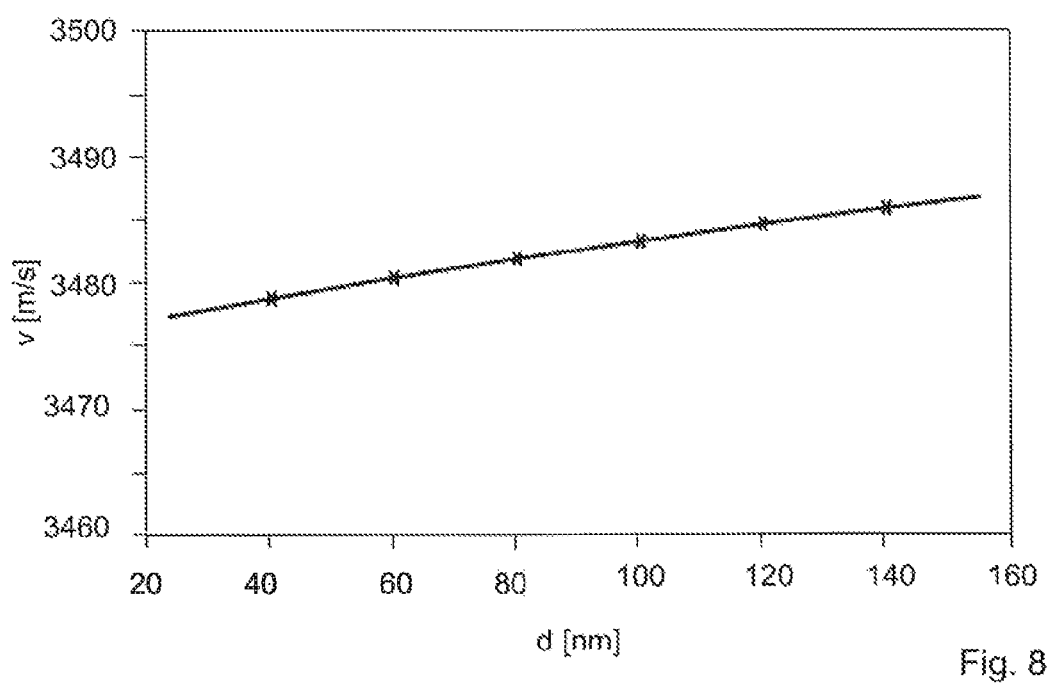
FIG. 8 shows the thickness-dependent velocity of a Rayleigh mode.

FIG. 8 shows the calculated propagation velocity of a Rayleigh mode, e.g., of a main mode, as a function of the layer thickness in the waveguide system in FIG. 7. The velocity increases as the thickness increases. The Love mode and the Rayleigh mode have an opposite thickness dependence for the propagation velocities and thus—given approximately the same wavelength—for the frequencies.

Figure 9:
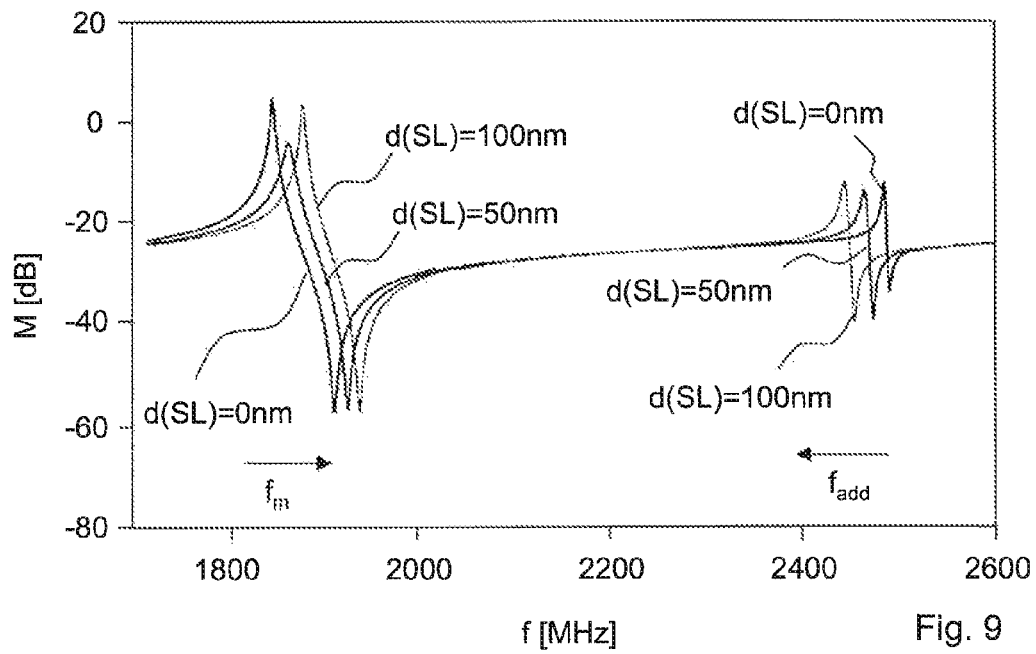
FIG. 9 shows the magnitude of the admittance of an electroacoustic transducer (e.g., an interdigitial transducer) having pronounced resonances of the main mode and of the secondary mode.

FIG. 9 shows the effect of the opposite thickness dependence of the separating layer SL. The presence of a separating layer SL having the thickness of 50 nm reduces the frequencies (resonant frequency, antiresonant frequency) $f_{add}$ of the secondary mode and increases the frequencies $f_m$ of the main mode. A further increase in the thickness to 100 nm furthermore reduces the frequencies $f_{add}$ of the secondary mode, while the frequencies of the main mode $f_m$ are increased.

Figure 10:
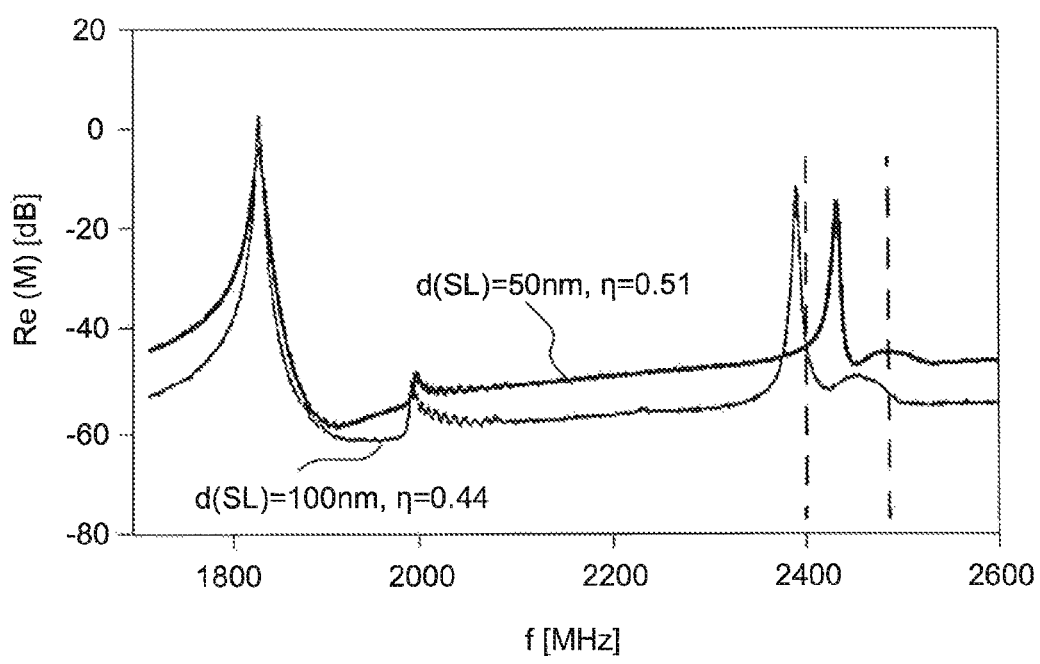
FIG. 10 shows the real part of the admittance of two interdigital transducers for different metallization ratios and different thicknesses of the separating layer. In this case, the frequency position of the main resonance of the transducer having the thicker separating layer and the lower metallization ratio is adjusted by an increase in the finger distance to the frequency position of the transducer having the thinner separating layer and the higher metallization ratio.

FIG. 10 shows the real part of the admittance, in one case for an electroacoustic component having a 50 nm thick separating layer SL and a metallization ratio η of 0.51 in comparison with a component having a 100 nm thick separating layer with a metallization ratio η of 0.44. The increase in the thickness of the separating layer and the reduction of the metallization ratio reduce the frequency spacing between the main mode and the secondary mode; the frequency of the main mode is increased in principle. The frequency shift is compensated for by an increase in the finger distance, such that the frequency of the main mode is again found at its original position. In this case, the reduced frequency spacing between the main mode and the secondary mode remains, such that the position of the secondary mode as viewed in absolute terms is shifted downward and is situated below a critical region.

In this regard, an electroacoustic component is thus obtained in which the disturbing contributions of undesired wave modes are reduced, without additional resonators or layer systems having to be applied.

Figure 11:
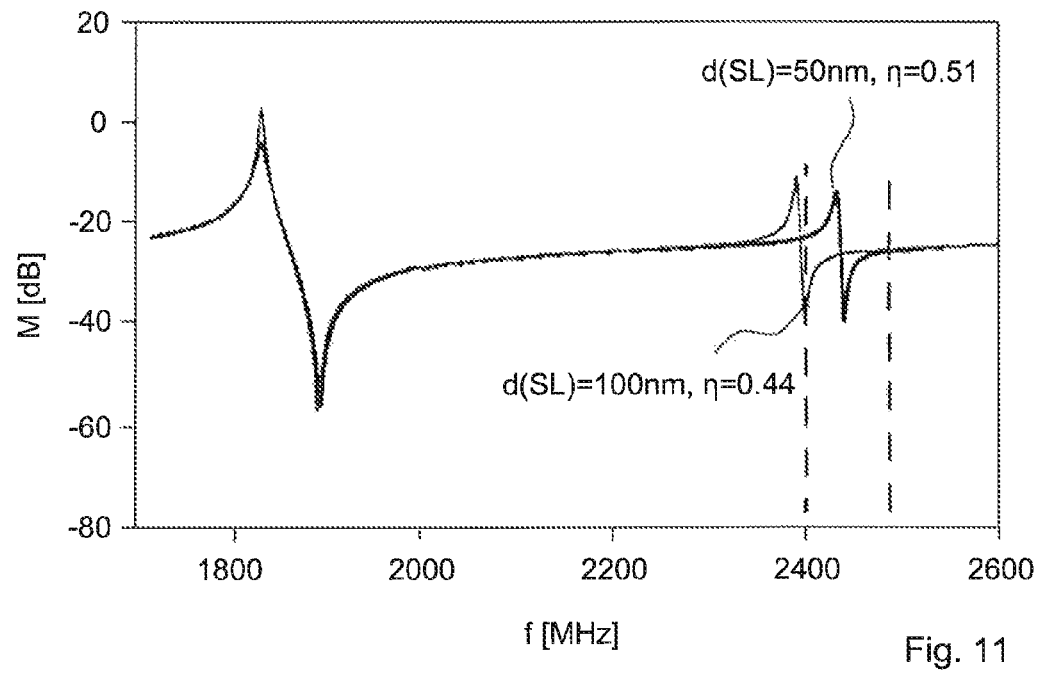
FIG. 11 shows the magnitude of the admittance of an electroacoustic transducer (e.g., an interdigitial transducer) having pronounced resonances of the main mode and of the secondary mode.

FIG. 11 shows the magnitude of the admittance for the layer systems shown in FIG. 10.

Figure 12:
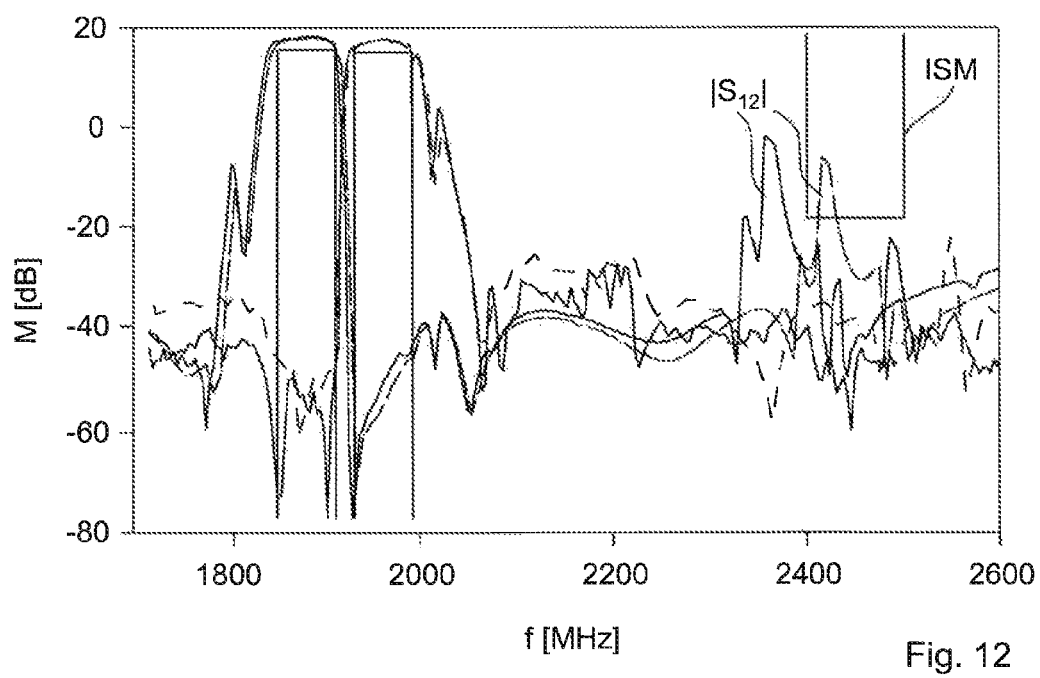
FIG. 12 shows the transfer function of two band 2 duplexer components, in one case for a conventional component and in one case for an optimized component.

FIG. 12 shows the transfer function of two WCDMA band 2 duplexers constructed with a conventional and with an optimized layer system. The illustration shows the functions $S_{12}$ of the TX transmission filters between amplifier and antenna and the transfer function S23 of the RX reception filters between antenna and receiver. As a result of the reduced frequency spacing between main mode and secondary mode, the disturbing resonance that projects distinctly beyond the −20 dBm level particularly in the TX transmission path is shifted downward out of the ISM band. At the same time, the resonators of the filters are optimized by the scaling of the finger distances with regard to the band 2 frequency positions, such that they fulfil the corresponding specifications in the useful bands.

Figure 13:
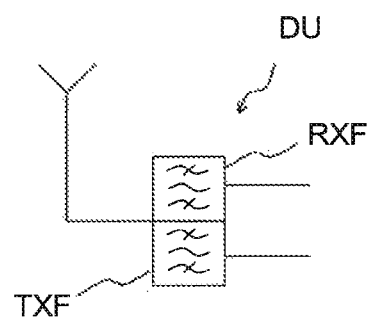
FIG. 13 shows a duplexer.

FIG. 13 shows a duplexer DU having a transmission filter TXF and a reception filter RXF. The component EAC can be used in each of the two filters. The component itself can comprise the filter functionality and, if appropriate, also further electrical functions.

An electroacoustic component is not restricted to one of the exemplary embodiments described. Exemplary embodiments in which the features mentioned above are combined or exemplary embodiments which, e.g., also have further metallization structures or material layers likewise constitute exemplary embodiments according to the invention.

The invention claimed is:

1. An electroacoustic component, comprising:
   a piezo layer;
   an electrode layer above the piezo layer and configured to, when a voltage is applied to electrode layer, cause propagation of acoustic waves in the electroacoustic component, the propagation having a main mode having a frequency $f_m$ and a secondary mode having a frequency $f_{add}$;
   a separating layer, wherein the separating layer comprises a material having an opposite thickness dependence for the frequencies $f_m$, $f_{add}$; and
   a temperature compensation layer between the electrode layer and the separating layer.

2. The electroacoustic component according to claim 1, wherein:
   the main mode is a Rayleigh mode and the secondary mode is a Love mode; and
   the separating layer is arranged above the electrode layer.

3. The electroacoustic component according to claim 1, further comprising at least one of a bottom adhesion layer between the piezo layer and the electrode layer or a top adhesion layer between the electrode layer and the temperature compensation layer.

4. The electroacoustic component according to claim 3, wherein:
   the piezo layer comprises LiNbO$_3$;
   at least one of the bottom adhesion layer or the top adhesion layer comprise(s) Ti;
   the electrode layer comprises at least one of Cu or Ag; and
   the separating layer comprises Si$_3$N$_4$.

5. The electroacoustic component according to claim 4, comprising a bottom adhesion layer and a top adhesion layer, wherein:
   the piezo layer comprises 128° Y-X cut LiNbO$_3$;
   the bottom adhesion layer comprises a 5.5 nm Ti layer;
   the electrode layer comprises a 2.5 nm thick Ag layer and a 160 nm thick Cu layer thereon;
   the top adhesion layer comprises a 5.5 nm thick Ti layer;
   the temperature compensation layer comprises a 700 nm to 730 nm thick SiO2 layer; and
   the separating layer comprises an 80 nm to 140 nm thick Si$_3$N$_4$ layer.

6. The electroacoustic component according to claim 5, wherein the separating layer has a thickness of 110 nm.

7. The electroacoustic component according to claim 4, wherein:
   the component is part of a duplexer operating with a surface acoustic wave (SAW) and having a transmission filter and a reception filter; and
   the transmission filter has a metallization ratio of η=0.44 and the reception filter has a metallization ratio of η=0.55.

8. A method for producing an electroacoustic component having a main mode having a frequency $f_m$ and a secondary mode having a frequency $f_{add}$, comprising:
   arranging an electrode layer above a piezo layer;
   arranging a separating layer above the electrode layer;
   arranging a temperature compensation layer between the electrode layer and the separating layer; and
   separating the frequencies $f_m$ and $f_{add}$ by increasing the thickness of the separating layer.

9. The method according to claim 8, wherein manufacturing variations are minimized by spatially resolved reduction of the thickness of the separating layer.

10. A method for producing an electroacoustic component, the method comprising:
    forming a piezo layer over a wafer;
    forming an electrode layer over the piezo layer;
    forming a temperature compensation layer over the electrode layer;
    forming a separating layer above the electrode layer and over the temperature compensation layer;
    taking measurements to determine a frequency of a main mode and a frequency of a secondary mode; and
    altering a thickness of the separating layer based upon the measurements.

11. The method according to claim 10, wherein altering the thickness comprises increasing the thickness of the separating layer to separate the frequency of the main mode from the frequency of the secondary mode.

12. The method according to claim 10, wherein altering the thickness comprises removing material of the separating layer.

13. The method according to claim 10, wherein the forming steps form the piezo layer, electrode layer and separating layer of a plurality of electroacoustic components; and
    wherein taking the measurements comprises taking measurements of selected ones of the electroacoustic components.

14. The method according to claim 13, further comprising determining locations of the wafer based on the measurements, wherein the altering comprises altering the thickness of the separating layer based on the determined locations.

15. The method according to claim 10, wherein manufacturing variations are compensated by spatially resolved reduction of the thickness of the separating layer.

16. The method according to claim 10, further comprising forming an adhesion layer between the piezo layer and the electrode layer or between the electrode layer and the temperature compensation layer.

17. The method according to claim 16, wherein:
    the piezo layer comprises LiNbO3;
    the adhesion layer comprises Ti;
    the electrode layer comprises Cu or Ag; and
    the separating layer comprises $Si_3N_4$.

18. A method of suppressing a secondary mode having a frequency $f_{add}$, the method comprising:
    applying a voltage to an electrode layer of an electroacoustic component such that acoustic waves propagate in the electroacoustic component, the propagation including a main mode having a frequency $f_m$, and the secondary mode, wherein the electrode layer is arranged above a piezo layer of the electroacoustic component, a separating layer of the electroacoustic component is arranged above the electrode layer, and a temperature compensation layer of the electroacoustic component is arranged between the electrode layer and the separating layer; and
    suppressing the secondary mode, based on a thickness of the separating layer, wherein the separating layer comprises a material having an opposite thickness dependence for the frequencies $f_m$, $f_{add}$.

* * * * *